United States Patent [19]
Fu

[11] Patent Number: 6,084,458
[45] Date of Patent: Jul. 4, 2000

[54] BI-DIRECTIONAL TRANSISTOR STRUCTURE

[75] Inventor: Kuan-Yu Fu, Hsinchu, Taiwan

[73] Assignee: United Microelectronics Corp., Hsin-Chu, Taiwan

[21] Appl. No.: 09/086,380

[22] Filed: May 28, 1998

[30] Foreign Application Priority Data

Jan. 23, 1998 [TW] Taiwan ................................ 87100937

[51] Int. Cl.[7] ................................................ H03K 17/687
[52] U.S. Cl. .......................... 327/330; 327/324; 327/403; 327/505; 327/318
[58] Field of Search ..................... 327/313, 314, 327/315, 318, 319, 320, 308, 309, 330, 331, 324, 325, 389, 391, 403, 404, 425, 426, 423, 493, 494, 473, 505, 461

[56] References Cited

U.S. PATENT DOCUMENTS

| | | | |
|---|---|---|---|
| 3,947,727 | 3/1976 | Stewart | 327/328 |
| 4,382,218 | 5/1983 | McVey | 327/327 |
| 5,010,261 | 4/1991 | Stegerwald | 327/404 |

Primary Examiner—Tuan T. Lam
Attorney, Agent, or Firm—J. C. Patents; Jiawei Huang

[57] ABSTRACT

A bi-directional transistor structure is provided, which can help solve the problem of degraded performance due to hot carrier injection (HCI) effect that is otherwise prominent in conventional bi-directional transistors. This bi-directional transistor structure includes the following: a first diode element whose negative end is connected to the first I/O port and whose positive end is connected to a first node; a first MOS transistor element whose first source/drain electrode is connected to the first node connected to the positive end of the first diode element, whose second source/drain electrode is connected to the second I/O port and whose gate is connected to a second node; a second diode element whose negative end is connected to the second I/O port and whose positive end is connected to a third node; and a second MOS transistor element whose first source/drain electrode is connected to the first I/O port, whose second source/drain electrode is connected to the third node connected to the positive end of the second diode element and whose gate is connected to the second node connected to the gate of the first MOS transistor element. In the foregoing bi-directional transistor structure, the first and second MOS transistor elements can be either NMOS transistors or PMOS transistors. This bi-directional transistor structure has an advantage over the prior art since two different routes are provided for the directional operations, which can help prevent the unsymmetrical HCI effect.

5 Claims, 2 Drawing Sheets

BI-DIRECTIONAL TRANSISTOR STRUCTURE

CROSS-REFERENCE TO RELATED APPLICATION

This application claims the priority benefit of Taiwan application serial no. 87100937, filed Jan. 23, 1998, the full disclosure of which is incorporated herein by reference.

BACKGROUND OF THE INVENTION

1. Field of the Invention

This invention relates to bi-directional semiconductor devices, and more particularly, to a bi-directional transistor structure.

2. Description of Related Art

A MOS (metal-oxide semiconductor) transistor is called bi-directional if its source and drain can be interchanged for use, and unidirectional if they cannot. In the literature of this specification, the term "source/drain electrode" is used to refer to such an electrode of the MOS transistor that can be used either as a source or as a drain. In 0.25 μm submicron ULSI (ultra-large-scale integration), the undesired effect of hot carrier injection (HCI) in bi-directional MOS transistor elements is about $10^2$ times worse than that of uni-directional devices. A semiconductor device with bi-directional transistor elements is therefore considerably inferior in performance than that with uni-directional ones. The HCI effect is unsymmetrical and this causes the forming of undesired inter-faces and the gathering of carriers near the drain junction in the bi-directional device. These in turn form charge traps that degrade the performance of the device.

SUMMARY OF THE INVENTION

It is therefore an objective of the present invention to provide an improved bi-directional transistor structure that does not cause the above-mentioned drawbacks due to HCI effect.

In accordance with the foregoing and other objectives of the present invention, an improved bi-directional transistor structure is provided, which includes the following constituent elements:

(a) a first diode element whose negative end is connected to the first I/O port and whose positive end is connected to a first node;

(b) a first MOS transistor element whose first source/drain electrode is connected to the first node connected to the positive end of the first diode element, whose second source/drain electrode is connected to the second I/O port, and whose gate is connected to a second node;

(c) a second diode element whose negative end is connected to the second I/O port and whose positive end is connected to a third node; and (d) a second MOS transistor element whose first source/drain electrode is connected to the first I/O port, whose second source/drain electrode is connected to the third node connected to the positive end of the second diode element, and whose gate is connected to the second node connected to the gate of the first MOS transistor element.

In the foregoing bi-directional transistor structure, the first and second MOS transistor elements can be either NMOS transistors or PMOS transistors. This bi-directional transistor structure has an advantage over the prior art since two different routes are provided for the directional operations, which can help prevent the unsymmetrical HCI effect.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
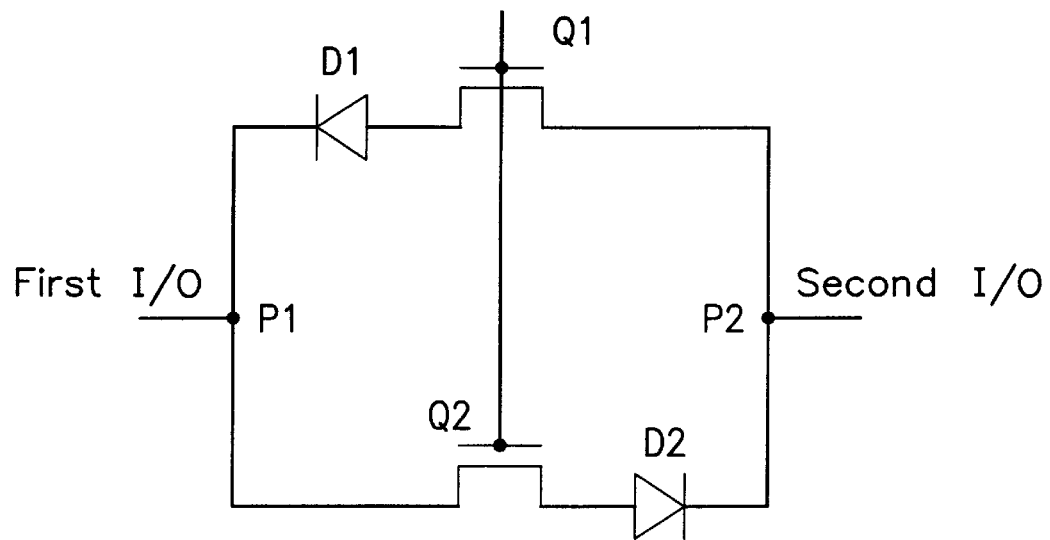
FIG. 1 is a schematic diagram of the bi-directional transistor structure according to the invention.

FIG. 1 is a schematic diagram of the bi-directional transistor structure according to the invention, which can help lessen the undesired HCI effect so as to provide a better performance to the IC device utilizing the bi-directional transistor structure of the invention.

As shown, the bi-directional transistor structure of the invention includes a first diode element D1, a second diode element D2, a first MOS transistor element Q1 and a second MOS transistor element Q2. These elements are connected in such a manner that the first diode element D1 has its negative end connected to a first I/O (input/output) port P1 and its positive end connected to one source/drain electrode of the first MOS transistor element Q1. The second diode element D2 has its negative end connected to a second I/O port P2 and its positive end connected to one source/drain electrode of the second MOS transistor element Q2. The first MOS transistor element Q1 has its gate connected to the gate of the second MOS transistor element Q2, its first source/drain electrode connected to the positive end of the first diode element D1 allowing the first source/drain electrode to be connected in a forward bias direction via the first diode element D1 to the first I/O port P1 and its second source/drain electrode connected directly to the second I/O port P2. The second MOS transistor element Q2 has its first source/drain electrode connected directly to the first I/O port P1 and a second source/drain electrode connected to the positive end of the second diode element D2 allowing the second source/drain electrode to be connected in a forward bias direction via the second diode element D2 to the second I/O port P2.

The foregoing bi-directional transistor structure allows the input to be connected to the first I/O port P1 and the output to be taken from the second I/O port P2, or vice versa.

In the case of using the first I/O port P1 as input and the second I/O port P2 as output, the input signal at the first I/O port P1 will be routed via the second MOS transistor element Q2 and the second diode element D2 to the second I/O port P2. By contrast, in the case of using the second I/O port P2 as input and the first I/O port P1 as output, the input signal at the second I/O port P2 will be routed via the first MOS transistor element Q1 and the first diode element D1 to the first I/O port P1. This bi-directional transistor structure is therefore more advantageous than the prior art since two different routes are provided for the bi-directional operations, which can help prevent the unsymmetrical HCI effect of the prior art.

Figure 2:
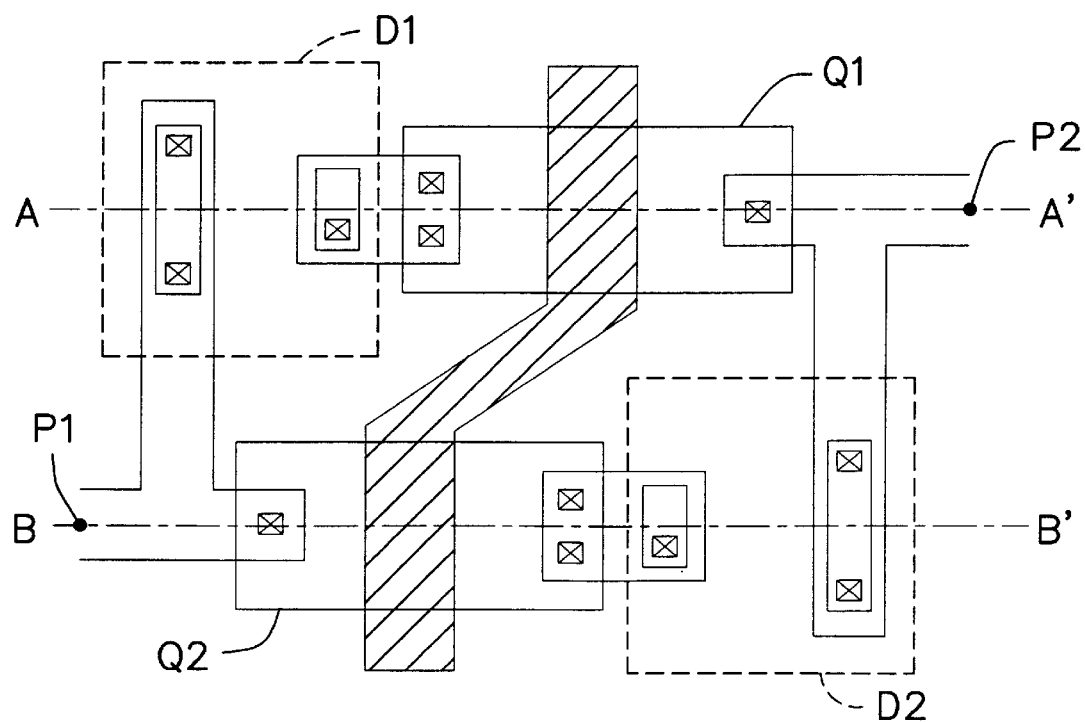
FIG. 2 is a schematic top view of the circuit layout of the bi-directional transistor structure of the invention on a semiconductor substrate.
Figure 3:
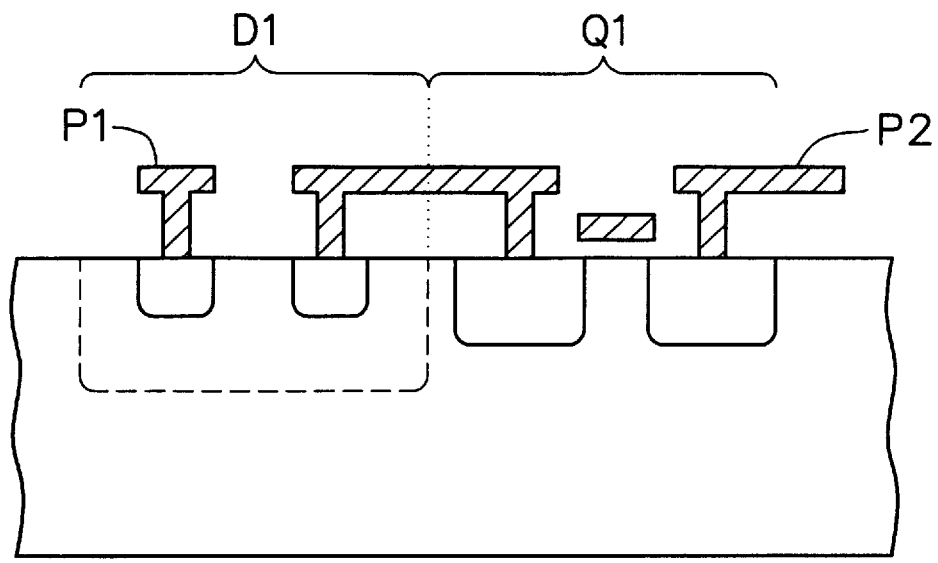
FIG. 3 is a schematic cross-sectional view of the bi-directional transistor structure of FIG. 2 cutting through the line A-A'.
Figure 4:
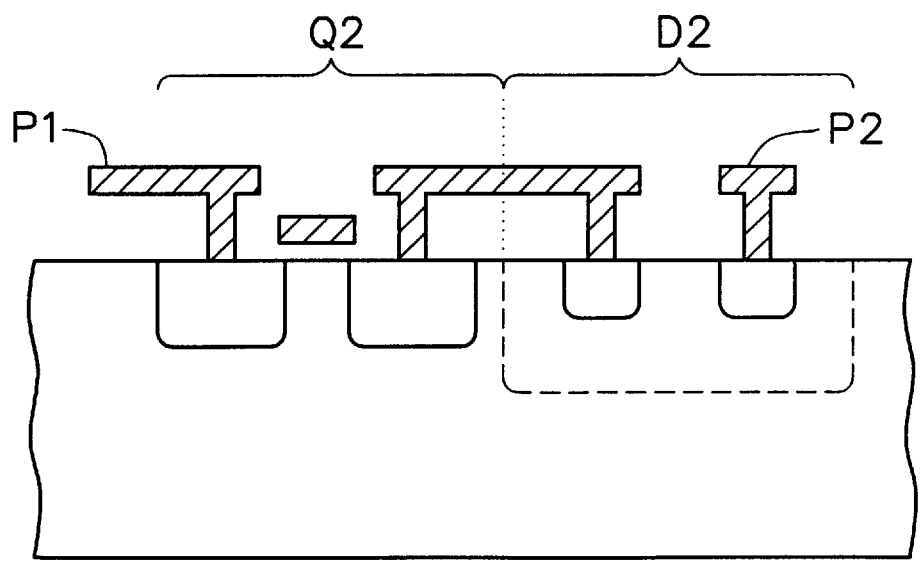
FIG. 4 is a schematic cross-sectional view of the bi-directional transistor structure of FIG. 2 cutting through the line B-B'.

One example of the implementation of the bi-directional transistor structure of FIG. 1 on a semiconductor substrate is illustrated in FIGS. 2–4, wherein FIG. 2 shows the circuit layout of the bi-directional transistor structure of FIG. 1 on the substrate; FIG. 3 shows a schematic cross-sectional view of the bi-directional transistor structure of FIG. 2 cutting through the line A-A'; and FIG. 4 shows a schematic cross-sectional view of the bi-directional transistor structure of FIG. 2 cutting through the line B-B'. In FIGS. 2–4, the constituent elements D1, D2, Q1, Q2 of the invention shown in FIG. 1 are designated by the same reference numerals. In the semiconductor device of FIGS. 2–4, the first and second MOS transistor elements Q1, Q2 are implemented as NMOS transistors (N-type MOS transistors), but they can also be implemented as PMOS transistors.

Although the bidirectional transistor structure of the invention will take up an increased layout area on the wafer and will cause the drain drive voltage to be lowered, it is nonetheless has an advantage over the prior art thanks to the improved performance due to the prevention of the unsymmetrical HCI effect. The problem of the low drain drive voltage can be compensated by either increasing the drain-gate voltage or reducing the channel length of the MOS transistor.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A bidirectional transistor structure having a first I/O port and a second I/O port which are interchangeable for I/O connection, said bi-directional transistor structure consisting of:
   a first diode element whose negative end is connected to the first I/O port and whose positive end is connected to a first node;
   a first MOS transistor element of a first conductivity whose first source/drain electrode is connected to the first node connected to the positive end of said first diode element, whose second source/drain electrode is connected to the second I/O port and whose gate is connected to a second node;
   a second diode element whose negative end is connected to the second I/O port and whose positive end is connected to a third node; and
   a second MOS transistor element of a first conductivity whose first source/drain electrode is connected to the first I/O port, whose second source/drain electrode is connected to the third node connected to the positive end of said second diode element and whose gate is connected to the second node connected to the gate of said first MOS transistor element, wherein the first MOS transistor is located in position between the positive end of the first diode element and the negative end of the second diode element, and the second MOS transistor is located in position between the negative end of the first diode element and the positive end of the second diode element.

2. The bi-directional transistor structure of claim 1, wherein said first and second MOS transistor elements are each an N-type MOS transistor.

3. The bi-directional transistor structure of claim 1, wherein said first and second MOS transistor elements are each a P-type MOS transistor.

4. A bi-directional transistor structure having a first I/O port and a second I/O port which are interchangeable for I/O connection, said bi-directional transistor structure consisting of:
   a first diode element whose negative end is connected to the first I/O port and whose positive end is connected to a first node;
   a first NMOS transistor element whose first source/drain electrode is connected to the first node connected to the positive end of said first diode element, whose second source/drain electrode is connected to the second I/O port and whose gate is connected to a second node;
   a second diode element whose negative end is connected to the second I/O port and whose positive end is connected to a third node; and
   a second NMOS transistor element whose first source/drain electrode is connected to the first I/O port, whose second source/drain electrode is connected to the third node connected to the positive end of said second diode element and whose gate is connected to the second node connected to the gate of said first NMOS transistor element, wherein the first NMOS transistor is located in position between the positive end of the first diode element and the negative end of the second diode element, and the second NMOS transistor is located in position between the negative end of the first diode element and the positive end of the second diode element.

5. A bi-directional transistor structure having a first I/O port and a second I/O port which are interchangeable for I/O connection, said bi-directional transistor structure consisting of:
   a first diode element whose negative end is connected to the first I/O port and whose positive end is connected to a first node;
   a first PMOS transistor element whose first source/drain electrode is connected to the first node connected to the positive end of said first diode element, whose second source/drain electrode is connected to the second I/O port and whose gate is connected to a second node;
   a second diode element whose negative end is connected to the second I/O port and whose positive end is connected to a third node; and
   a second PMOS transistor element whose first source/drain electrode is connected to the first I/O port, whose second source/drain electrode is connected to the third node connected to the positive end of said second diode element and whose gate is connected to the second node connected to the gate of said first PMOS transistor element, wherein the first PMOS transistor is located in position between the positive end of the first diode element and the negative end of the second diode element, and the second PMOS transistor is located in position between the negative end of the first diode element and the positive end of the second diode element.

* * * * *